United States Patent
Coulon et al.

(10) Patent No.: US 9,998,689 B2
(45) Date of Patent: Jun. 12, 2018

(54) IMAGING DEVICE WITH FILTERING OF THE INFRARED RADIATION

(71) Applicants: STMicroelectronics (Grenoble 2) SAS, Grenoble (FR); STMicroelectronics (Rousset) SAS, Rousset (FR); STMicroelectronics SA, Montrouge (FR)

(72) Inventors: David Coulon, Aix en Provence (FR); Benoit Deschamps, Sassenage (FR); Frederic Barbier, Grenoble (FR)

(73) Assignees: STMicroelectronics (Grenoble 2) SAS, Grenoble (FR); STMicroelectronics (Rousset) SAS, Rousset (FR); STMicroelectronics SA, Montrouge (FR)

( * ) Notice: Subject to any disclaimer, the term of this patent is extended or adjusted under 35 U.S.C. 154(b) by 18 days.

(21) Appl. No.: 14/557,158

(22) Filed: Dec. 1, 2014

(65) Prior Publication Data
US 2015/0083894 A1   Mar. 26, 2015

Related U.S. Application Data

(62) Division of application No. 13/316,938, filed on Dec. 12, 2011, now Pat. No. 8,901,692.

(30) Foreign Application Priority Data

Dec. 15, 2010 (FR) .................................. 10 60561

(51) Int. Cl.
| H01L 21/00 | (2006.01) |
| H04N 5/345 | (2011.01) |
| H01L 27/146 | (2006.01) |
| H04N 5/378 | (2011.01) |

(52) U.S. Cl.
CPC ....... *H04N 5/345* (2013.01); *H01L 27/14605* (2013.01); *H01L 27/14647* (2013.01); *H01L 27/14689* (2013.01); *H04N 5/378* (2013.01)

(58) Field of Classification Search
CPC .. H04N 5/345; H04N 5/378; H01L 27/14605; H01L 14/14647; H01L 27/14647
USPC ................ 257/435, E31.111; 438/16, 73, 78
See application file for complete search history.

(56) References Cited

U.S. PATENT DOCUMENTS

| 6,894,265 B2 | 5/2005 | Merrill et al. |
| 7,218,347 B2 * | 5/2007 | Shinohara ......... H01L 27/14645 257/E27.134 |
| 2002/0058353 A1 | 5/2002 | Merrill |
| 2004/0178478 A1 | 9/2004 | Shizukuishi |
| 2010/0165161 A1 * | 7/2010 | Kobayashi ........ H01L 31/02005 348/300 |

* cited by examiner

*Primary Examiner* — Robert Huber
(74) *Attorney, Agent, or Firm* — Slater Matsil, LLP

(57) ABSTRACT

An imaging device includes at least one photosite formed in a semiconducting substrate and fitted with a filtering device for filtering at least one undesired radiation. The filtering device is buried in the semiconducting substrate at a depth depending on the wavelength of the undesired radiation.

20 Claims, 3 Drawing Sheets

IMAGING DEVICE WITH FILTERING OF THE INFRARED RADIATION

CROSS-REFERENCE TO RELATED APPLICATIONS

This application is a divisional of U.S. patent application Ser. No. 13/316,938, filed Dec. 12, 2011, which claims the priority benefit of French patent application number 1060561, filed on Dec. 15, 2010. These applications are hereby incorporated by reference to the maximum extent allowable by law.

TECHNICAL FIELD

The invention relates to imaging devices and more particularly the filtering of undesired radiations such as the infrared radiation.

BACKGROUND

When an image is captured by an imaging device, a broad band of wavelengths is captured by the device. Depending on the finality of the image, not all the wavelengths are of use. In the case of imaging devices such as CMOS or CCD sensors of a digital camera, for example, only a small portion of the captured radiation is of use, this portion corresponding to the wavelengths of the visible domain. The infrared radiation, for example, that is undesired in the captured images then disrupts the image.

Specifically, infrared radiation also generates electrons by photoelectric effect. These electrons thus generated by the infrared radiation induce a signal which, by mixing with the signal corresponding to the visible radiation, will disrupt the measured signal and add an additional interference value to the useful signal. The quality of the images is thereby damaged.

In general, in order to filter the infrared radiation arriving on a photosite, the imaging devices such as CMOS or CCD sensors comprise an infrared filter placed above the photosite, that is to say between the incident radiations and the photosite. This infrared filtering prevents the infrared radiation from reaching the photosite while the visible radiation passes through the filter and can reach the photosite and generate electron-hole pairs then inducing a measurable signal.

The application of such infrared filters, usually produced in glass or in plastic, makes the production of an imaging device more complex, increases the production costs and increases the overall height since the height of the superposed infrared filter must be added to the height of the photosite.

SUMMARY

According to one embodiment, the proposal is to alleviate the abovementioned drawbacks by proposing an imaging device comprising photosites fitted with filtering means incorporated into the photosite, and more particularly buried beneath the photodiode.

According to one aspect, an imaging device is proposed comprising at least one photosite formed in a semiconducting substrate and fitted with a filtering device for filtering at least one undesired radiation.

According to a general feature of this aspect, the filtering device is buried in the semiconducting substrate at a depth depending on the wavelength of the undesired radiation.

Preferably, at least one undesired radiation comprises an infrared radiation and the buried portion is situated at a depth of between 2 µm and 5 µm.

The undesired radiation may correspond to the infrared radiation, but it may also correspond to a thinner or broader frequency band included in the visible or invisible radiation.

The at least one photosite preferably comprises a first semiconducting P-N junction and the buried portion comprises a second semiconducting P-N junction located beneath the first semiconducting junction.

Since the second semiconducting P-N junction of the buried portion is located beneath the first P-N junction, the filtered radiation will preferably include longer wavelengths than the desired and measured wavelengths. The dimensions and the placing of the second P-N junction therefore depend on the undesired radiation that it is intended to filter out.

The photodiode of a conventional photosite does not usually comprise a semiconducting junction. By modifying the structure of the photodiode during the construction of the photosite, it is possible to carry out a filtering of an undesired radiation such as an infrared radiation. The installation of the photodiode is therefore carried out in order to obtain a superposition of two semiconducting junctions, a first junction generating a measured signal in order to obtain an image, and a second junction placed beneath the first making it possible to filter the undesired radiation.

In other words, it is possible to produce, in a substrate having dimensions that are generally designed to produce a single semiconducting junction of a photosite, a double semiconducting junction. The buried semiconducting junction makes it possible to filter the radiation by trapping the electrons generated by photoelectric effect by the incident radiation at this buried junction.

Advantageously, the filtering device may also comprise a polarization device configured to polarize the second junction at a voltage greater than the polarization voltage of the first junction.

This polarization of the second semiconducting junction at a voltage greater than the polarization voltage of the first semiconducting junction makes it possible to confine in the second junction the electrons created in this same junction. The collection of these electrons is thus improved by this difference in polarization voltage. Moreover, because of the depth at which the second junction is situated, the electrons created in this second junction have been mainly generated by undesired radiation, such as infrared radiation. This trapping of electrons therefore makes it possible to filter out the undesired radiation.

Advantageously, the device may comprise at least one set of adjacent photosites each fitted with a filtering device, and the buried portion of the filtering devices of the adjacent photosites may be coupled together.

The device may also advantageously comprise two continuous semiconducting layers of the opposite conductivity type, incorporating the second P-N junctions of the buried means associated with the adjacent photosites.

Advantageously, the device may comprise a first group of photosites not fitted with the filtering devices, and a second group of photosites each fitted with a filtering device.

According to another aspect, a method is proposed for filtering at least one undesired radiation illuminating at least one photosite produced in a semiconducting substrate.

According to a general feature of this other aspect, the filtering is carried out in the semiconducting substrate at a depth depending on the wavelength of the undesired radiation.

Preferably, the at least one undesired radiation comprises an infrared radiation and the filtering is carried out in the semiconducting substrate at a depth of between 2 µm and 5 µm.

Advantageously, the filtering may comprise a trapping of the electrons created in a second semiconducting junction placed beneath a first semiconducting junction of the photosite.

Preferably, the second semiconducting junction is polarized at a polarization potential greater than the polarization potential of the first semiconducting junction.

BRIEF DESCRIPTION OF THE DRAWINGS

Other advantages and features of the invention will appear on examination of the detailed description of modes of application and of embodiments which are in no way limiting, and of the appended drawings in which.

DETAILED DESCRIPTION OF ILLUSTRATIVE EMBODIMENTS

Figure 1:
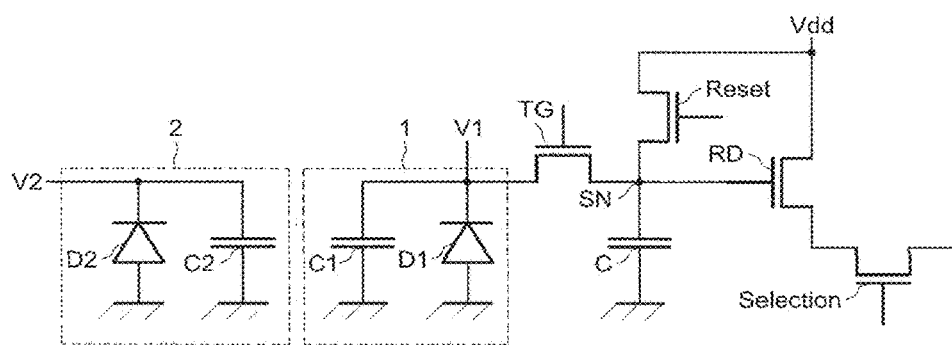
FIG. 1 shows an electrical diagram of a semiconducting photosite fitted with a filtering device according to one embodiment of the invention.

FIG. 1 shows an electrical diagram of a semiconducting photosite fitted with a filtering device according to one embodiment of the invention.

The semiconducting photosite comprises a first semiconducting P-N junction 1 forming first load collection device making it possible to convert the incident radiation, mainly the visible radiation, into electron-hole pairs by photoelectric effect, and thus generate a signal from the electrons that is proportional to the number of incident photons received.

This first junction 1 is represented in the electrical diagram by a capacitor C1 and a diode D1 mounted in parallel. The first junction 1 is coupled, in the illustrated example, to control electronics comprising in this instance a set of four controlled transistors TG, RD, Reset and Selection. The signal generated by this first junction 1 is transferred via a transfer transistor TG (for Transfer Gate) to a sensing node SN.

The sensing node SN is formed of a total of capacitors C on which the voltage is measured when a sensing transistor RD (for Read out Gate), also coupled to the sensing node SN, is enabled. The sensing node SN is also coupled to a Reset transistor making it possible to reset the first junction 1. The sensing transistor RD and the Reset transistor are coupled together at the power-supply voltage Vdd. Finally, the read out transistor RD is also coupled to a Selection transistor controlled by control circuitry of the matrix network capable of controlling the photosites depending on the column and the row.

The semiconducting photosite also comprises a second semiconducting junction 2 forming second load collection device making it possible to convert the radiation reaching this second junction 2, mainly the infrared radiation, into an electron-hole pair by photoelectric effect, and thus generate a signal from the electrons that is proportional to the number of photons received.

This second junction 2 is polarized at a voltage V2 which makes it possible to clear away the generated electrons.

The first junction 1 and the second junction 2 each receive a different effective radiation because of their position within the photosite. Specifically, as illustrated in FIG. 2, the first junction 1 and the second junction 2 are superposed on one another, the first junction 1 being placed above the second junction 2.

Figure 2:
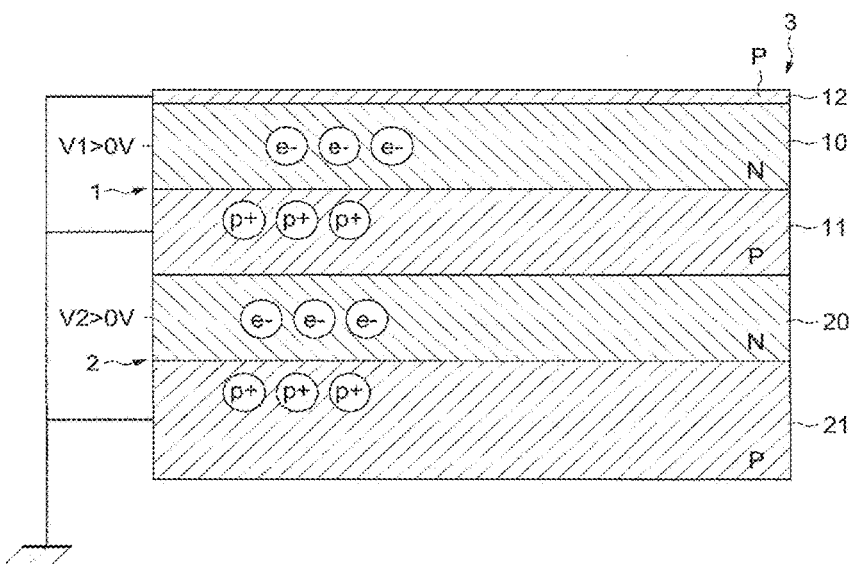
FIG. 2 illustrates a vertical section of a double junction formed in a semiconducting substrate according to one embodiment of the invention.

FIG. 2 illustrates a vertical section of a double junction formed in a semiconducting substrate according to one embodiment of the invention.

Shown in this FIG. 2 is a semiconducting substrate 3 comprising the first semiconducting junction 1 superposed on the second semiconducting junction 2.

The substrate 3 is a semiconducting substrate having standard dimensions, notably in height, and initially P-doped. In order to obtain the double junction, first of all a first implantation of an N-doped layer 20 is carried out, for example of dosed phosphorous between $4 \times 10^{12}$ and $8 \times 10^{12}$ at/cm$^2$ at an energy of between 2 and 5 MeV. This first implantation is carried out so as to be superposed on a P-doped layer 21 of substrate 3 having a thickness of between 3 and 10 µm.

Then in turn a second implantation of a P-doped layer 12 is carried out, for example, of boron dosed between $1.10^{12}$ and $5.10^{12}$ at/cm$^2$ at an energy of between 10 and 50 keV, a third implantation of an N-doped layer 10, for example, of arsenic dosed between $4.10^{12}$ and $8.10^{12}$ at/cm$^2$ at an energy of between 100 and 300 keV, and a fourth implantation of a P-doped layer 11, for example, of boron at a dose between $4.10^{12}$ and $8.10^{12}$ at/cm$^2$ at an energy of between 4 and 15 keV.

This provides a superposition of a pinched-off photodiode comprising successively the layers 11, 10 and 12 respectively P-doped, N-doped and P-doped and defining the first P-N junction 1 at the layers 10 and 11. The layers 11 and 12 are connected to the same potential, for example ground. This configuration provides another photodiode comprising a second P-N junction 2 comprising the layers 20 and 21 respectively N-doped and P-doped.

The superposition of the layers 10 and 12 forms a P-N junction with a surface making it possible to limit the dark current. The dark current corresponds to a current induced by surface defects.

The various installations are carried out so as to obtain a first P-N junction 1 situated at a depth of between 0 and 0.5 µm and a second P-N junction 2 situated at a depth of between 2 and 5 µm.

Figure 3:
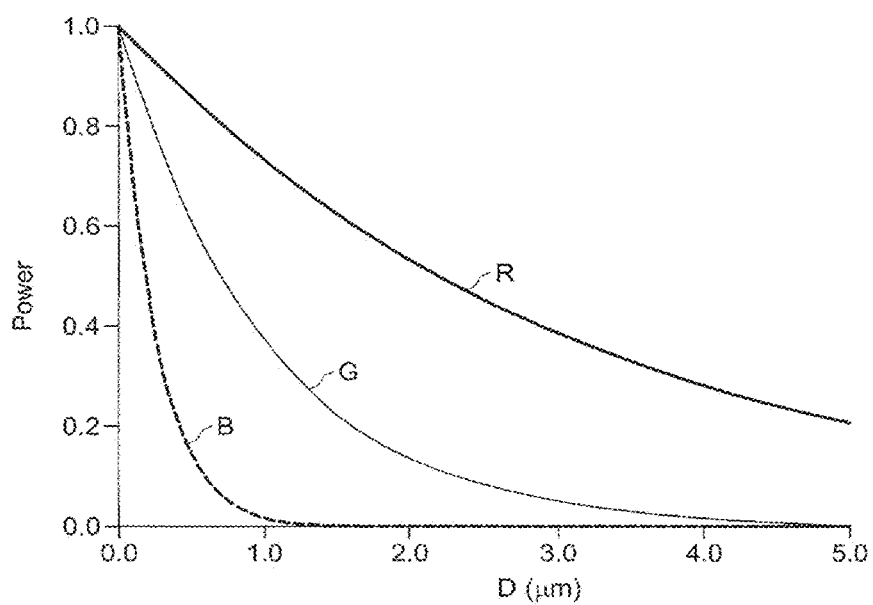
FIG. 3 illustrates graphically an example of absorption rate of the photons through the thickness of the semiconductor depending on their wavelength of the incident radiation.
Figure 4:
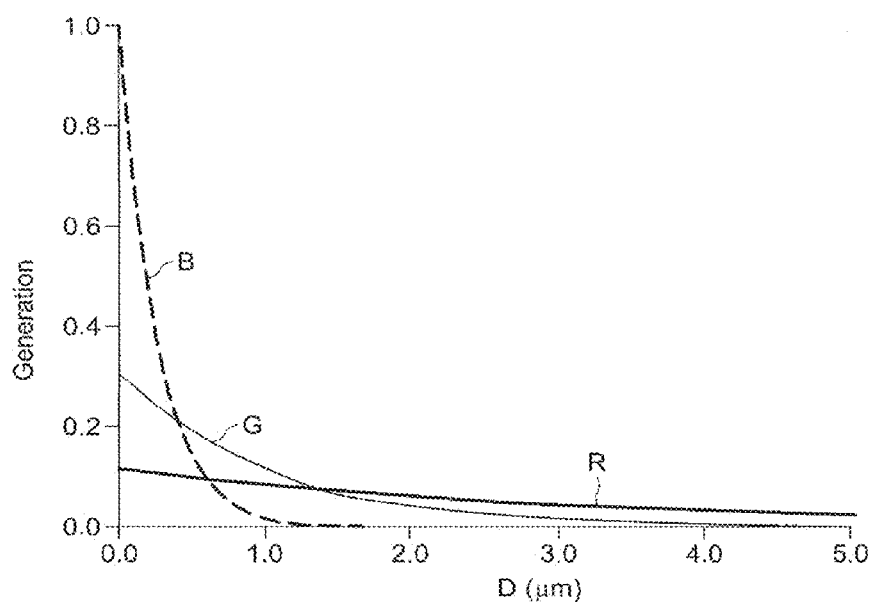
FIG. 4 illustrates graphically an example of rate of generation of electron-hole pairs through the thickness of the semiconductor as a function of the wavelength of the incident radiation.

The filtering of the radiation by virtue of the use of a semiconducting junction buried in a semiconducting substrate beneath a main junction, such as the second junction 2 located beneath the first junction 1, is explained with the aid of FIGS. 3 and 4.

FIGS. 3 and 4 illustrate, respectively, on a graph the rate of absorption of the photons and the rate of generation of electron-hole pairs through the thickness of a semiconducting substrate depending on the wavelength of the incident radiation.

The graph of FIG. 3 shows, on three curves R, G and B, the evolution of the optical power (on the Y axis) as a function of the depth of substrate traversed (on the X axis in micrometers) for three distinct wavelengths. The wavelength considered for the curve B corresponds to blue (450 nm), the wavelength considered for the curve G corresponds to green (550 nm) and the wavelength considered for the curve R corresponds to red (650 nm). The infrared corresponds to the wavelengths above 650 nm. On the Y axis, the optical power is normalized relative to the power of the incident radiation before entry into the substrate for each wavelength.

On reading this graph, it can be seen that the decrease in the optical power of the incident radiation is greater, the shorter the radiation wavelength. Thus, a short radiation wavelength is absorbed more rapidly than a long radiation wavelength. Specifically, in this example, the optical power of the blue radiation, curve B, decreases more rapidly than that of the red, curve R. The optical power of the blue radiation is virtually zero after the incident radiations have traversed 1.2 μm of substrate, while the optical power of the red radiation has reduced only by half at a depth of 2.5 μm.

Consequently, at a considerable depth of substrate, for example, more than 2 μm, the infrared radiation that belongs to the wavelengths greater than the wavelengths of the visible domain will have been much less absorbed than the visible radiation. The infrared radiation will therefore be in the majority at this depth relative to the visible radiation.

The graph of FIG. 4 shows, for the same three wavelengths as in FIG. 3, the evolution of the relative rate of generation of electron-hole pairs (on the Y axis), as a function of the depth of substrate traversed (on the X axis in micrometers).

On reading this graph, it can be seen that the short wavelengths have a rate of generation of electron-hole pairs that is higher on the surface, that is to say at slight depth of substrate, than the long wavelengths, while at depth, that is to say, at a considerable depth of the substrate, the long wavelengths have a rate of generation of electron-hole pairs that is higher than the short wavelengths.

Therefore, it can be seen that, over the first microns of the substrate, the majority of the electron-hole pairs generated by the incident radiation will be generated by the visible radiation, the electron-hole pairs generated by the infrared radiation being negligible, whereas at depth, from approximately 2 μm for example, the electron-hole pairs generated will be mainly generated by the infrared radiation, the electron-hole pairs generated by the visible radiation being negligible, the power of the visible radiation being less (FIG. 3) and the rate of generation of electron-hole pairs equally being less than that for the infrared radiation.

Therefore, in FIG. 2, it can be understood that the electron-hole pairs generated by the incident radiation at the first junction 1 are generated mainly by the visible radiation, while the electron-hole pairs generated at the second junction 2 are mainly generated by the infrared radiation. The electrons originating from the infrared radiation generated at the second junction 2 are then cleared from the photosite, while the electrons of the first junction generated mainly by the visible radiation create a signal which is measured at the sensing node SN. This signal thus measured is a signal corresponding to the visible radiation filtered from the majority of the infrared radiation.

Moreover, the first junction 1 is polarized intrinsically at a first positive polarization voltage V1, while the second junction 2 is polarized at a second positive polarization voltage V2. In order to improve the trapping of the electrons originating from the infrared radiation in the second junction 2 and to prevent them from migrating to the first junction 1, the second polarization voltage V2 is higher than the first intrinsic polarization voltage V1. The first polarization voltage V1 is generated intrinsically by the doping of the pinched-off photodiode.

In FIG. 1, the first polarization voltage V1 is the floating voltage defined by doping of the pinched-off diode.

Figure 5:
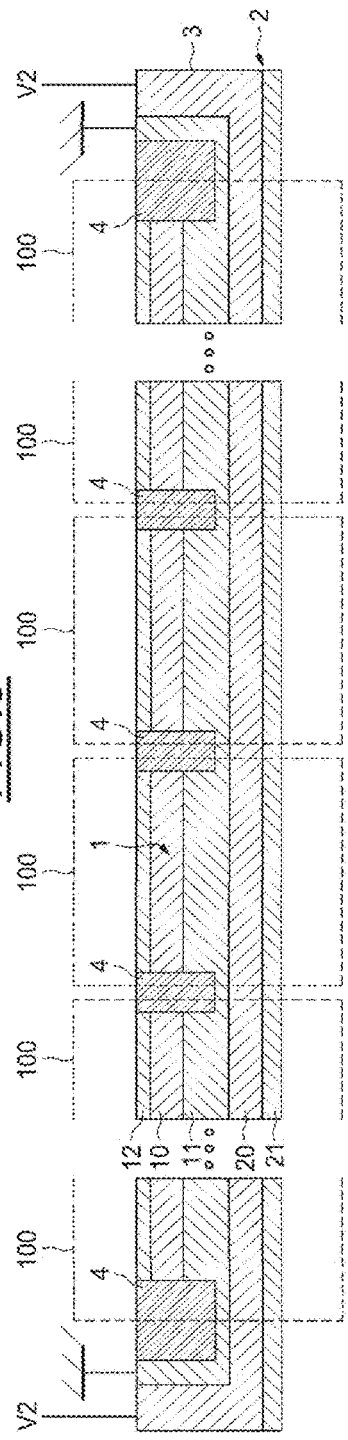
FIG. 5 represents schematically a view in section of an imaging device comprising a set of photosites fitted with filtering devices according to a first embodiment.

FIG. 5 shows schematically a view in section of an imaging device comprising a set of photosites 100 fitted with filtering devices according to a first embodiment.

In this embodiment, the imaging device comprises, on one and the same row or one and the same column of a matrix network of photosites, a set of photosites 100 fitted with filtering devices.

Each photosite 100 formed in a semiconducting substrate 3, initially with positive conductivity, comprises a first semiconducting junction 1 comprising a layer 10 of negative conductivity comprised between two layers 11 and 12 of positive conductivity forming a pinched-off photodiode. A second semiconducting junction 2 is buried in the substrate 3 and located beneath the first junction 1. The junction 2 comprises a layer 20 of negative conductivity above a layer 21 of positive conductivity, thereby forming another photodiode.

The filtering devices of the photosites 100, that is to say the second junctions 2, are produced so as to be commoned, e.g., commonly connected. Thus, the layer 20 of negative conductivity of the second junction 2 is a DC layer produced at depth in the substrate 3 so as to obtain a second DC junction 2 over the whole row or over the whole column of photosites. The layer 20 of the second DC junction 2 is polarized at the second polarization voltage V2 so as to clear away the electrons generated at the second junction 2.

The first junction 1 of each photosite 100, and more particularly the N-doped layer 10, is insulated from the first junction 1 of the adjacent photosites 100. For this, an insulation wall 4 (e.g., trench isolation), made of silicon dioxide for example, is located between the first junctions 1 of the photosites 100.

Figure 6:
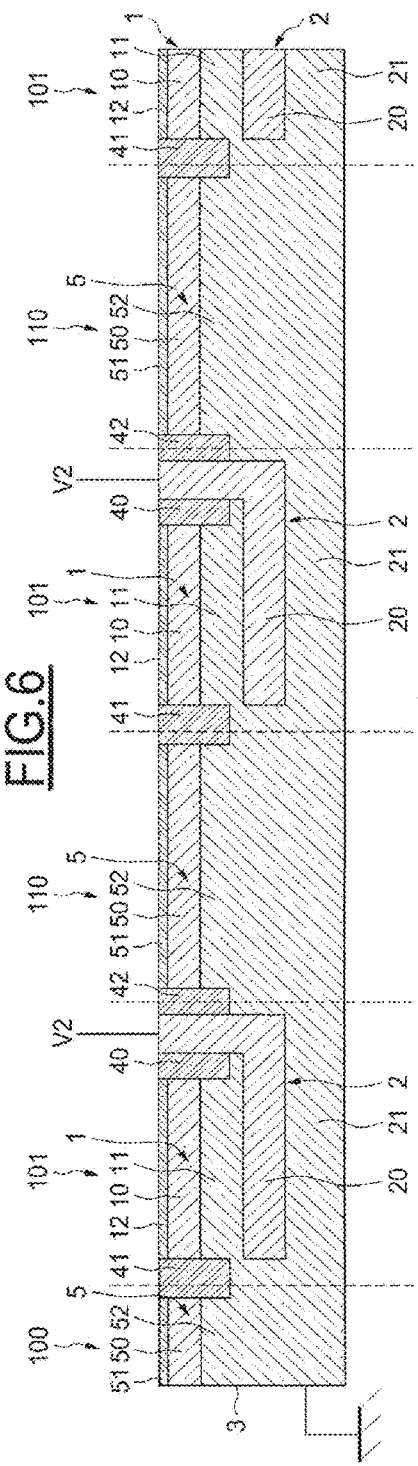
FIG. 6 represents schematically a view in section of an imaging device according to a second embodiment, comprising photosites fitted with filtering devices and photosites not fitted with filtering devices.

FIG. 6 shows schematically a view in section of an imaging device according to a second embodiment where photosites 101 fitted with filtering devices and photosites 110 not fitted with filtering devices.

In this second embodiment, the imaging device comprises, on one and the same row or one and the same column of a matrix network of photosites, photosites 101 fitted with filtering devices alternating with photosites 110 not fitted with filtering devices.

Each photosite 101 formed in a semiconducting substrate 3, initially P-doped, comprises a first semiconducting junction 1 comprising an N-doped layer 10 comprised between two P-doped layers 11 and 12 forming a pinched-off photodiode, and a second semiconducting junction 2, buried in the substrate 3 and placed beneath the first junction 1, comprising an N-doped layer 20 installed above a P-doped layer 21, forming another photodiode.

The installation of the layer 20 of the second junction 2 is carried out so that the layers 11 and 21 respectively of the first and second junctions 1 and 2 are coupled together. The first junction 1 is produced so as to retain an access to the layer 20 of the second junction 2 on the surface of the photosite 100. The layer 20 of the second junction 2 is configured in an L shape with a portion rising to the surface of the substrate 3 so as to polarize the second junction 2 at the second polarization voltage V2. The layer 10 of the first junction 1 is insulated from the layer 20 of the second junction 2 by an insulation wall 40.

Photosites 110 not fitted with filtering devices are placed on either side of a photosite 101 fitted with filtering devices.

One photosite 110 comprises a single junction 5 comprising an N-doped layer 50 comprised between two P-doped layers 51 and 52, forming a pinched-off photodiode.

The photosites 101 fitted with filtering devices are insulated from the photosites 110 not fitted with filtering devices by insulation walls 41 and 42.

In another embodiment, it is also possible to produce an imaging device comprising photosites fitted with filtering devices with different radiation ranges.

The filtering function of each photosite is thus produced at different depths so as to filter the undesirable radiation in the photosite.

As an example, a photosite configured to capture the red radiation will comprise a filtering device comprising a portion buried at a depth corresponding to the filtering of the infrared radiation.

A photosite configured to capture the blue radiation will comprise a filtering device buried at a depth corresponding to the filtering of the green radiation, of the red radiation, and of the infrared radiation.

A photosite configured to capture the green radiation will comprise a filtering device comprising a portion buried at a depth corresponding to the filtering of the red radiation and of the infrared radiation.

What is claimed is:

1. A method for filtering comprising:
sensing radiation illuminating a photosite disposed in a semiconducting substrate, the semiconducting substrate comprises a first n-doped layer, a second n-doped layer, a first p-doped layer, and a second p-doped layer, the sensing comprising providing a non-zero first voltage directly at the first n-doped layer and providing a constant zero voltage directly at the first p-doped layer; and
filtering undesired radiation illuminating the photosite disposed in the semiconducting substrate, wherein
the filtering is carried out using a filtering device in the semiconducting substrate at a depth that is a function of a wavelength of the undesired radiation,
the filtering comprises applying a constant non-zero second voltage directly at the second n-doped layer to carry away charges generated as a result of the undesired radiation and applying the constant zero voltage directly at the second p-doped layer, wherein the second voltage is greater than the first voltage, and
sensing the radiation and filtering the undesired radiation are simultaneously carried out at the photosite.

2. The method according to claim 1, wherein the undesired radiation comprises infrared radiation and the filtering is carried out in the semiconducting substrate at a depth of between 2 µm and 5 µm.

3. The method according to claim 1, wherein the filtering device includes a second semiconducting junction located beneath a first semiconducting junction of the photosite and wherein the filtering further comprises trapping electrons created in the second semiconducting junction.

4. The method according to claim 3, wherein the second semiconducting junction is polarized at a second polarization potential greater than a first polarization potential of the first semiconducting junction, and wherein the second polarization potential is applied by the second voltage.

5. The method of claim 3, wherein the filtering is performed at a plurality of photosites disposed in the semiconducting substrate, the plurality of photosites together comprising two continuous semiconducting layers that form the second semiconducting junction, wherein each of the plurality of photosites comprises a first semiconducting junction located above the second semiconducting junction.

6. The method of claim 3, wherein the filtering is performed at a first plurality of photosites arranged in rows, the rows further comprising a second plurality of photosites for which the filtering is not performed, wherein each of the first plurality of photosites comprises a second semiconducting junction located beneath a first semiconducting junction.

7. A method for filtering comprising:
generating electrons at a first semiconductor junction in a substrate;
sensing the electrons generated at the first semiconductor junction and providing a non-zero first voltage directly at a first n-doped layer of the first semiconductor junction and providing a constant zero voltage directly at a first p-doped layer of the first semiconductor junction;
generating electrons at a second semiconductor junction in the substrate, the second semiconductor junction arranged vertically in line with the first semiconductor junction;
applying the constant zero voltage directly at a second p-doped layer of the second semiconductor junction; and
applying a continuous non-zero polarizing second voltage directly at a second n-doped layer of the second semiconductor junction, wherein the second voltage is greater than the first voltage.

8. The method according to claim 7, wherein the second semiconductor junction is arranged in the substrate at a depth of between 2 µm and 5 µm.

9. The method according to claim 7, wherein the second semiconductor junction is arranged beneath the first semiconductor junction.

10. The method according to claim 9, wherein the second semiconductor junction is polarized at a second polarization potential greater than a first polarization potential of the first semiconductor junction, and wherein the second polarization potential is applied by the continuous non-zero polarizing second voltage.

11. The method of claim 9, wherein the filtering is performed at a plurality of photosites disposed in the substrate, the plurality of photosites together comprising two continuous semiconductor layers that form the second semiconductor junction, wherein each of the plurality of photosites comprises a first semiconductor junction located above the second semiconductor junction.

12. The method of claim 9, wherein the filtering is performed at a first plurality of photosites arranged in rows, the rows further comprising a second plurality of photosites for which the filtering is not performed, wherein each of the first plurality of photosites comprises a second semiconductor junction located beneath a first semiconductor junction.

13. A method of filtering comprising:
sensing, during a sense mode, electrons generated at a first semiconductor junction in a substrate at a first polarization potential;
continuously filtering, during an entirety of the sense mode, electrons generated at a second semiconductor junction in the substrate, wherein the second semiconductor junction is vertically aligned with the first semiconductor junction, and continuously filtering comprises continuously applying a second polarization potential directly at a p-doped layer of the second semiconductor junction, and the second polarization potential being greater than the first polarization potential to remove the electrons generated at the second semiconductor junction; and removing, during a reset mode, electrons generated at the first semiconductor junction.

14. The method of claim 13, wherein continuously filtering electrons generated at the second semiconductor junction comprises applying a continuous polarizing voltage at the second semiconductor junction so that electrons generated at the second semiconductor junction cannot be sensed.

15. The method of claim 13, further comprising filtering, during the reset mode, electrons generated at the second semiconductor junction in the substrate.

16. The method according to claim 13, wherein the second semiconductor junction is arranged in the substrate at a depth of between 2 µm and 5 µm.

17. The method according to claim 13, wherein continuously filtering further comprises trapping electrons created in the second semiconductor junction located beneath the first semiconductor junction.

18. The method according to claim 17, wherein the second semiconductor junction is polarized at a second polarization potential greater than a first polarization potential of the first semiconductor junction, wherein the electrons generated at the second semiconductor junction are a result of an infrared radiation.

19. The method of claim 17, wherein the filtering is performed at a plurality of photosites disposed in the substrate, the plurality of photosites together comprising two continuous semiconductor layers that form the second semiconductor junction, wherein each of the plurality of photosites comprises a first semiconductor junction located above the second semiconductor junction.

20. The method of claim 17, wherein the filtering is performed at a first plurality of photosites arranged in rows, the rows further comprising a second plurality of photosites for which the filtering is not performed, wherein each of the first plurality of photosites comprises a second semiconductor junction located beneath a first semiconductor junction.

* * * * *